US011223341B2

(12) United States Patent
Makkonen et al.

(10) Patent No.: US 11,223,341 B2
(45) Date of Patent: Jan. 11, 2022

(54) SUPPRESSING PARASITIC SIDEBANDS IN LATERAL BULK ACOUSTIC WAVE RESONATORS

(71) Applicant: VTT Technical Research Centre of Finland Ltd, Espoo (FI)

(72) Inventors: Tapani Makkonen, Espoo (FI); Tuomas Pensala, Espoo (FI); Markku Ylilammi, Espoo (FI)

(73) Assignee: VTT Technical Research Centre of Finland Ltd, Espoo (FI)

( * ) Notice: Subject to any disclaimer, the term of this patent is extended or adjusted under 35 U.S.C. 154(b) by 66 days.

(21) Appl. No.: 16/660,480

(22) Filed: Oct. 22, 2019

(65) Prior Publication Data

US 2021/0119600 A1 Apr. 22, 2021

(51) Int. Cl.
*H03H 9/02* (2006.01)
*H03H 9/17* (2006.01)
*H03H 9/54* (2006.01)

(52) U.S. Cl.
CPC .... *H03H 9/02125* (2013.01); *H03H 9/02015* (2013.01); *H03H 9/175* (2013.01); *H03H 9/177* (2013.01); *H03H 9/54* (2013.01)

(58) Field of Classification Search
CPC .. H03H 9/02125; H03H 9/02015; H03H 9/54; H03H 9/177; H03H 9/175
(Continued)

(56) References Cited

U.S. PATENT DOCUMENTS 6,211,600 B1 * 4/2001 Martin .............. H03H 9/14505 310/313 B
9,893,712 B2 2/2018 Meltaus et al.
(Continued)

FOREIGN PATENT DOCUMENTS

WO WO 01/06647 1/2001
WO WO 2011/131844 10/2011
(Continued)

OTHER PUBLICATIONS

Fattinger et al. "Optimization of acoustic dispersion for high performance thin film BAW resonators," Proc. IEEE International Ultrasonics Symposium, 2005, 1175-8.
(Continued)

*Primary Examiner* — Robert J Pascal
*Assistant Examiner* — Jorge L Salazar, Jr.
(74) *Attorney, Agent, or Firm* — Fish & Richardson P.C.

(57) ABSTRACT

Acoustic wave filter devices are disclosed. In an embodiment, the device includes an acoustic wave resonator and a reflecting layer located below the acoustic wave resonator. The wave resonator includes an input electrode including a first electrode and a counter electrode, a piezoelectric layer sandwiched between the first electrode and the counter electrode, and an output electrode. The piezoelectric layer has a first region covered by the first or the output electrode, and a second region not covered by any of the first and the output electrode. The first region has a second order acoustic thickness-shear resonance (TS2) mode dispersion curve with a first minimum frequency, and the second region has a TS2 mode dispersion curve with a second minimum frequency. The reflecting layer's thickness is such that a difference between the first minimum frequency and the second minimum frequency is less than 2% of a filter center frequency.

18 Claims, 12 Drawing Sheets

(58) Field of Classification Search
USPC .......................................... 333/133, 193–196
See application file for complete search history.

(56) References Cited

U.S. PATENT DOCUMENTS

| | | | | |
|---|---|---|---|---|
| 2013/0057360 | A1* | 3/2013 | Meltaus | H03H 9/02007 333/187 |
| 2013/0278356 | A1 | 8/2013 | Meltaus et al. | |
| 2014/0312994 | A1 | 10/2014 | Meltaus et al. | |
| 2015/0333730 | A1 | 11/2015 | Meltaus et al. | |

FOREIGN PATENT DOCUMENTS

| | | |
|---|---|---|
| WO | WO 2012/049372 | 4/2012 |
| WO | WO 2012/049374 | 4/2012 |
| WO | WO 2013/068652 | 5/2013 |

OTHER PUBLICATIONS

Meltaus et al., "Laterally Coupled BAW Filter using Two Acoustic Modes," Proc. IEEE International Ultrasonics Symposium, Jul. 2013, 232-5.

Meltaus et al., "Laterally Coupled BAW Filters with 5% Bandwidth," Proc. IEEE International Ultrasonics Symposium, Oct. 2010, 966-9.

Meltaus et al., "Laterally coupled solidly mounted BAW resonators at 1.9 GHz," Proc. IEEE International Ultrasonics Symposium, Sep. 2009, 847-50.

Pensala et al., "2-D Modeling of Laterally Acoustically Coupled Thin Film Bulk Acoustic Wave Resonator Filters," IEEE Transactions on ultrasonics, ferroelectrics, and frequency control, Nov. 2010, 57(11):2537-49.

Solie, "Tapered transducers-design and applications," Proc. IEEE International Ultrasonics Symposium, 1998, 1:27-37.

* cited by examiner

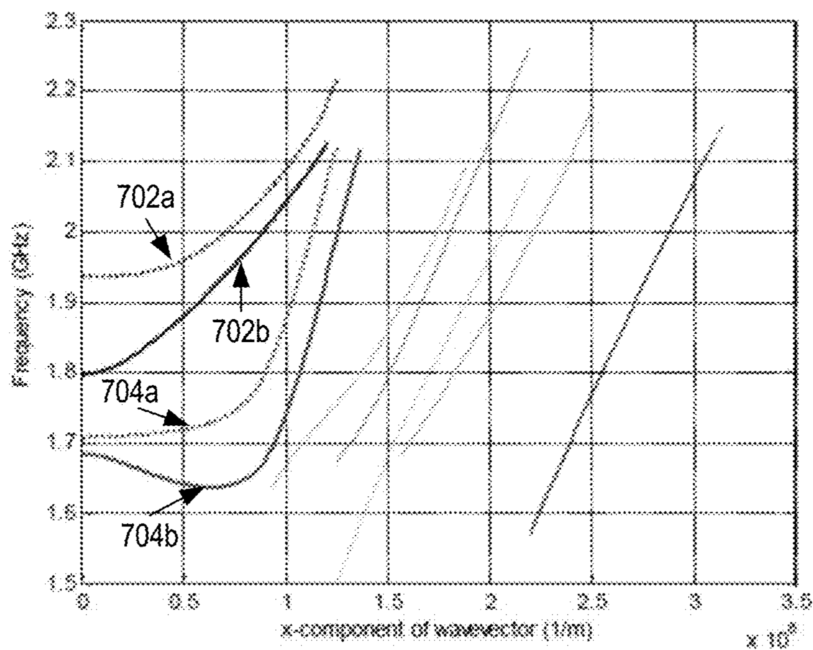
FIG. 7A1
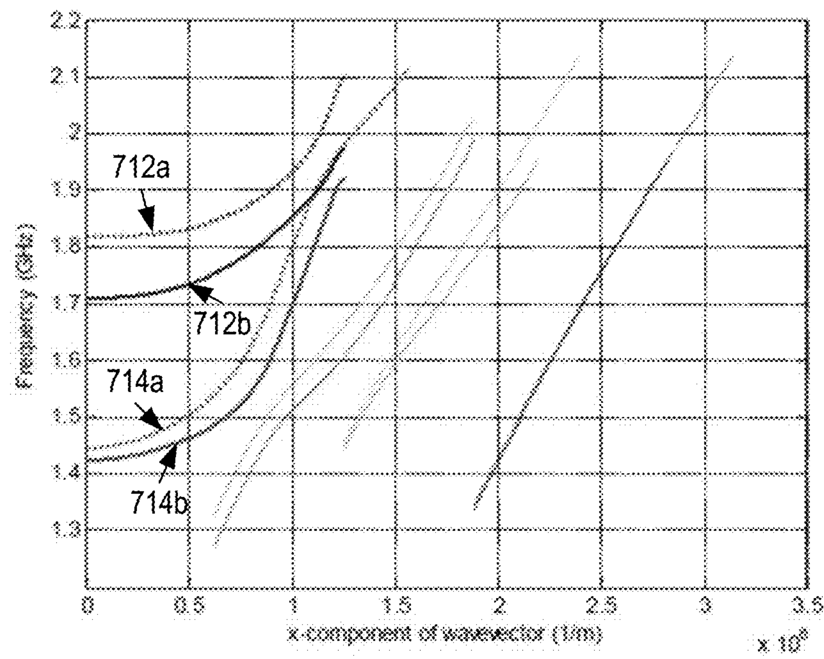
FIG. 7B1

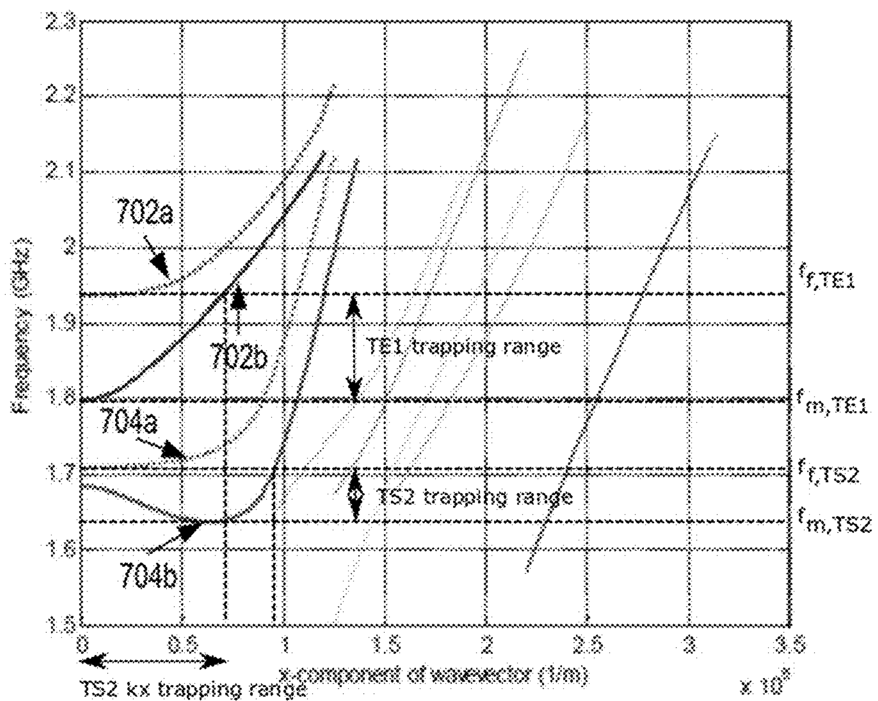
FIG. 7A2
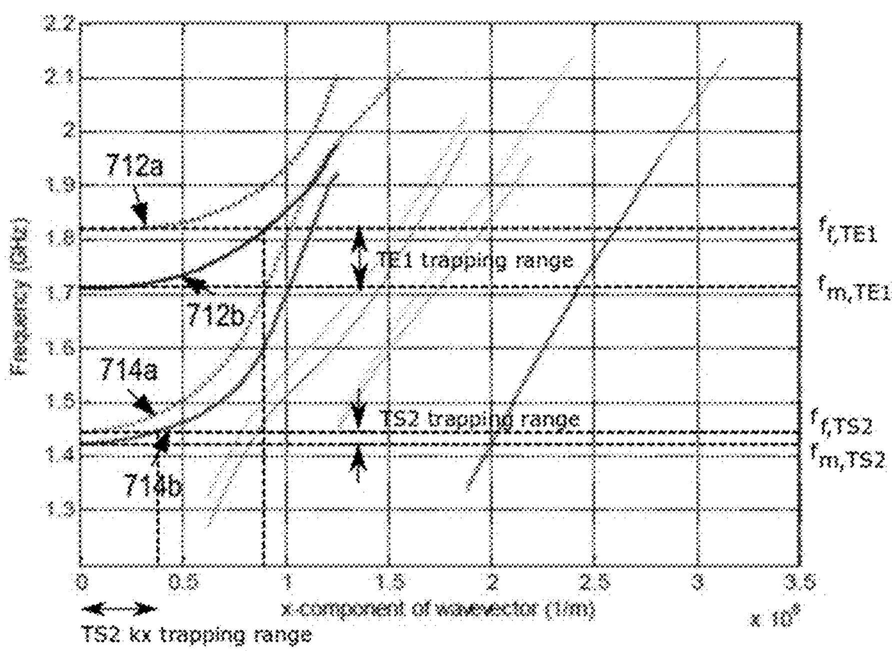
FIG. 7B2

SUPPRESSING PARASITIC SIDEBANDS IN LATERAL BULK ACOUSTIC WAVE RESONATORS

TECHNICAL FIELD

This specification relates to thin film radio-frequency acoustic wave filters.

BACKGROUND

Radio-frequency ("RF") components, such as resonators and filters, based on microacoustic and thin-film technology are widely used in radio applications such as: mobile phones, wireless networks, satellite positioning, etc. Their advantages over their lumped-element, ceramic, and electromagnetic counterparts include small size and mass-production capability.

SUMMARY

This specification describes technologies for band pass Lateral Bulk Acoustic Wave ("LBAW") filters. More particularly, the present disclosure provides techniques to suppress sidebands in LBAW filters and improve band pass filter characteristic of LBAW filters.

LBAWs can be used as band pass filters. The band pass filter may include one or more undesired (or parasitic) sidebands. Implementations of the present disclosure provide techniques to suppress the undesired sidebands by adding one or more acoustic resonators in parallel with the LBAW.

LBAW filters are formed from a piezoelectric layer sandwiched between two pairs of electrodes. One electrode from each pair is located on the top surface of the piezoelectric layer, and forms an input or an output of the LBAW. The input and output electrodes are separated by a gap. Each pair also has a counter electrode located on the bottom surface of the piezoelectric layer. By applying an alternating voltage across the piezoelectric layer at the input resonator, a mechanical resonance is formed in the piezoelectric layer below the input electrode. The piezoelectric layer thickness and the gap between electrodes can be designed such that this mechanical resonance is coupled across the gap to the output resonator. The frequency range at which such coupling occurs determines the achievable bandwidth (or width of passband) for the LBAW filter.

The foregoing and other embodiments can each optionally include one or more of the following features, alone or in combination.

In general, one innovative aspect of the subject matter described in this specification can be embodied in an acoustic wave filter device that includes an acoustic wave resonator and a reflecting structure located below the acoustic wave resonator. The acoustic wave resonator includes an input port (e.g., an electrode) including a first electrode and a counter electrode, a piezoelectric layer sandwiched between the first electrode and the counter electrode such that application of a radio frequency voltage between the first electrode and the counter electrode creates acoustic resonance waves in the piezoelectric layer, the acoustic resonance waves comprising acoustic thickness-extensional resonance modes and one or more acoustic thickness-shear resonance modes, and an output port (e.g., electrode). The piezoelectric layer has a first region covered by the first electrode or by the output port, and a second region not covered by any of the first electrode and the output port. The first region has a second order acoustic thickness-shear resonance (TS2) mode dispersion curve with a first minimum frequency ($f_m$), and the second region has a TS2 mode dispersion curve with a second minimum frequency ($f_f$). The reflecting structure located including at least a first reflecting layer. A thickness of the first reflecting layer is selected such that a difference between the first minimum frequency and the second minimum frequency is less than 5% (e.g., less than %2) of the first minimum frequency. Alternatively or in addition, the first reflecting layer's thickness can selected such that the frequency difference can be less than 5% (e.g., less than 2%) of a filter center frequency of the acoustic wave filter. The thickness is measured in a direction perpendicular to surface of the acoustic wave resonator.

The first reflecting layer can be at least 40% thicker than a quarter of a longitudinal acoustic wavelength at the filter center frequency in the reflecting layer.

In some implementations, the TS2 can propagate in the first and the second regions with lateral wavelengths of over 9 times a thickness of the piezoelectric layer.

Any (or each) of the first electrode and the output electrode can have a comb-shaped structure with a plurality of extensions. Multiple extensions of the first electrode can be interdigitated with multiple extensions of the output electrode. In some implementations, each extension has a width smaller than a wavelength associated with the first minimum frequency, the width of an extension being perpendicular to the length of the extension on the piezoelectric layer. In some implementations, the first electrode and the output electrode, in total, have 4 to 40 extensions.

The first reflecting layer of the reflecting structure can be in direct contact with a bottom surface of the acoustic wave resonator.

The reflecting structure can include a Bragg reflector. The Bragg reflector can include multiple layers with alternating high and low acoustic impedance materials, wherein a low acoustic impedance is lower than a high acoustic impedance. In some implementations, the first reflecting layer is a topmost layer of the Bragg reflector.

The first reflecting layer can include $SiO_2$. The thickness of the first reflecting layer can be between 1100 nm to 1400 nm.

In some implementations, the first electrode has an integrated geometry with the output electrode.

An embodiment disclosed herein is an acoustic wave filter device that includes (i) a piezoelectric layer, (ii) an input electrode comprising a first electrode on a top surface of the piezoelectric layer and a counter electrode below the piezoelectric layer, the electrode having a first comb-shaped structure with a plurality of input extensions, wherein an application of a radio frequency voltage between the input electrode and the counter electrode creates acoustic resonance modes in the piezoelectric layer, and (iii) an output electrode located on the top surface of the piezoelectric layer and physically separated from the first electrode. The output electrode has a second comb-shaped structure with a plurality of output extensions. The plurality of input extensions and the plurality of output extensions form a pattern that is periodically repeated on the top surface of the piezoelectric layer; a period of the pattern including a first number of input extensions and a second number of output extensions. At least one of the first and the second numbers is greater than 1.

The second number can be 2. The first number can be 1. The input extensions and the output extensions can be formed as an array of parallel extensions. The device can further include a Bragg reflector located below the counter electrode.

The subject matter described in this specification can be implemented in particular embodiments so as to realize one or more of the following advantages. Band pass filters described herein improve the band pass response of acoustic filters, e.g., LBAW filters, by suppressing parasitic side-bands. The suppression can be made in particular frequencies or over a range of frequencies. In addition, LBAW filters described herein can be simpler to fabricate because they use only a single piezoelectric layer as compared to two in vertically stacked bulk acoustic wave (BAW) coupled resonator filters. They can also operate at higher frequencies as surface acoustic wave (SAW) filters as their operation is determined more by piezoelectric layer thickness than interdigital transducer (IDT) electrode dimensions. In some embodiments, LBAW filters can also achieve a wider bandwidth than BAW filters. LBAW filters can perform as filters with a single lithographic patterning step as compared to close to 10 steps in BAW and can operate without reflectors needed in SAW, and thus in smaller size.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 7A1-7A2 and 7B1-7B2 depict dispersion curves for example LBAW filters.

Like reference numbers and designations in the various drawings indicate like elements.

DETAILED DESCRIPTION

Figure 1A:
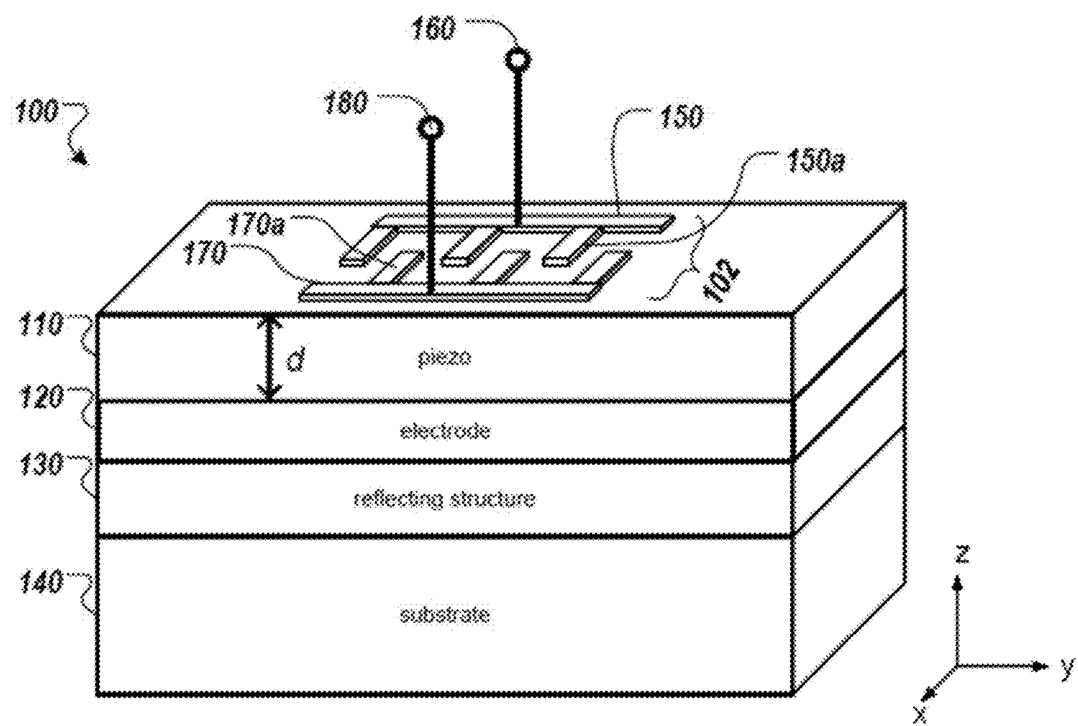
FIG. 1A is a schematic perspective view of a solidly-mounted LBAW filter.
Figure 1B:
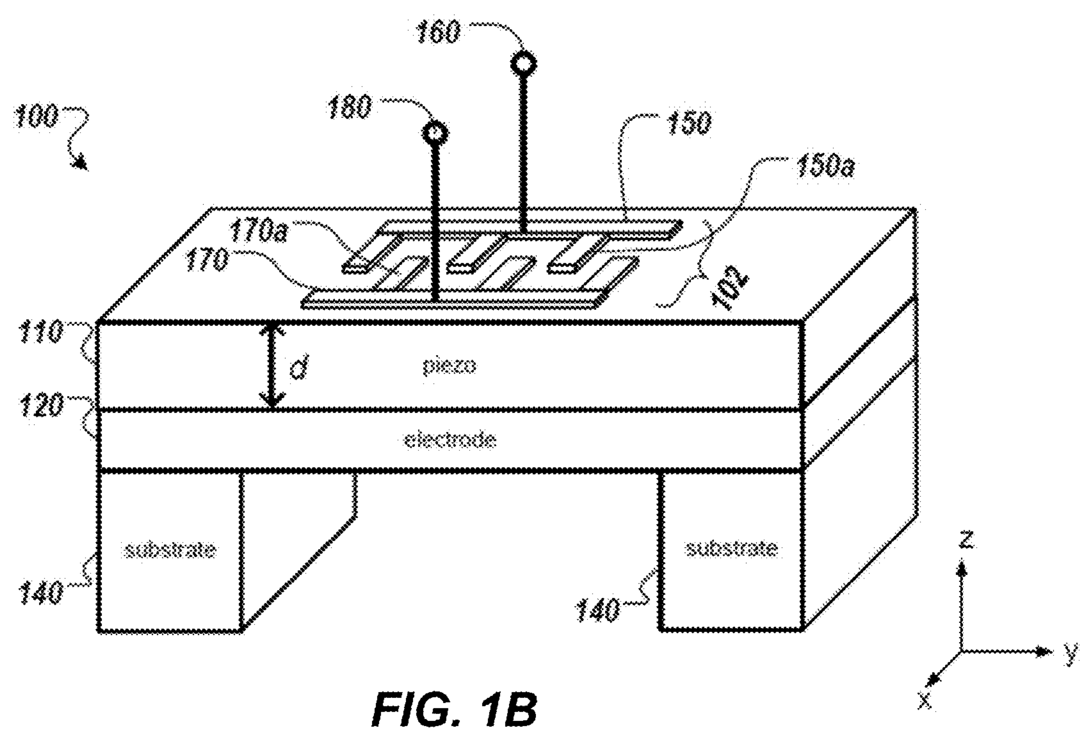
FIG. 1B is a schematic perspective view of a self-supported LBAW filter.
Figure 1C:
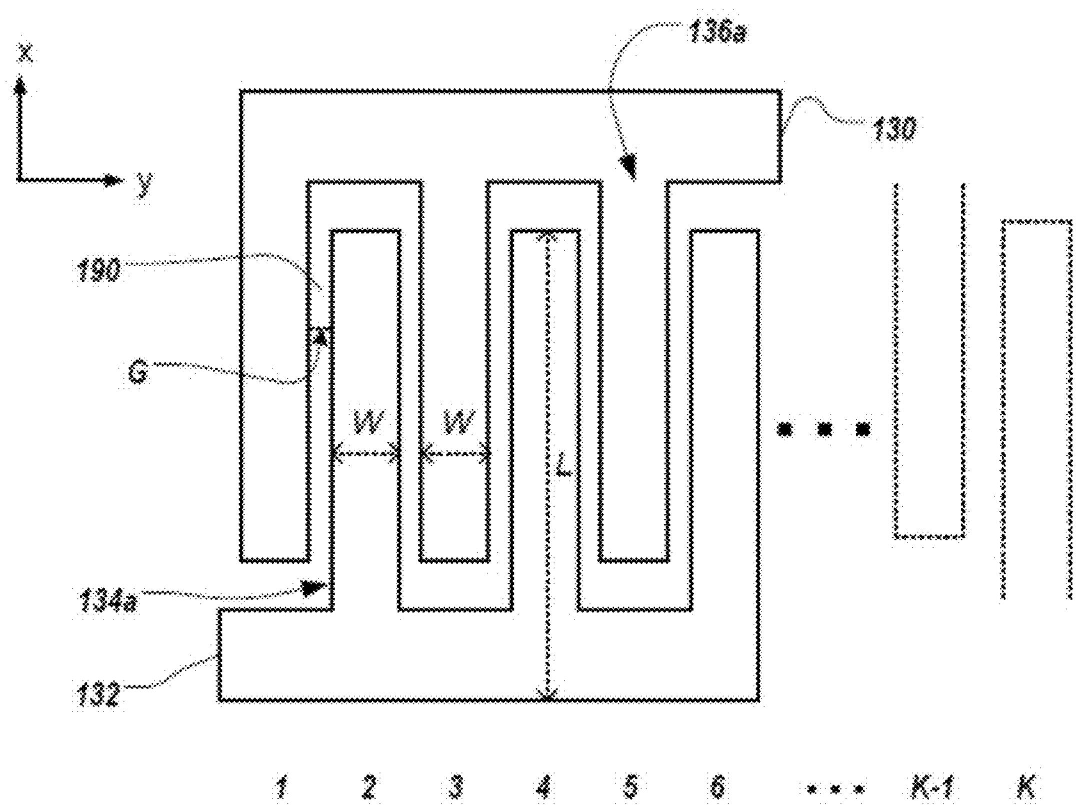
FIG. 1C is a schematic planar view of an interdigital transducer ("IDT") electrode structure.

FIGS. 1A, 1C show an example of an LBAW filter (or resonator) 100 with input 150 and output 170 electrodes that have an interdigitated geometry (also called "interdigital transducer" or "IDT" LBAW). LBAW filter 100 includes a piezoelectric ("piezo") layer 110, having a thickness d, an IDT electrode structure 102 located on the top surface of the piezo layer, and a bottom counter electrode 120 located on the bottom surface of the piezo layer. IDT electrode structure ("IDT") 102 includes two comb-shaped electrodes, 150 and 170, of conductive material, e.g., metal or polysilicon. IDT electrodes 150 and 170 have parallel extensions 150*a* and 170*a*, respectively, that provide the "tines" or "teeth" or "fingers" of the "comb." Electrode 150 and counter electrode 120 form an input resonator with piezo layer 110. Electrode 170 and counter electrode 120 form an output resonator with piezo layer 110.

Acoustic vibrations are created in piezo layer 110 by applying an oscillating (or alternating) input voltage across IDT electrode 150 and bottom counter electrode 120 at an input port 160. The applied voltage is transformed into a mechanical (e.g., acoustic) vibration via the piezoelectric effect. Under resonance conditions (e.g., with certain acoustic resonance modes, as detailed further below), this vibration can create a standing wave under input electrode 150 and an evanescent wave (with exponentially decaying amplitude) in the gap region 190. With appropriate selection of vibration frequencies and gap width G, the standing wave can couple mechanically across gap 190 from the piezo region under electrode 150 to piezo region under electrode 170 and create a similar standing wave in piezo layer 110 under electrode 170. The standing wave under electrode 170 results in an output signal voltage with the same frequency at an output port 180 via the reverse piezoelectric effect. The frequency range at which this coupling occurs in mechanical resonance with strong piezoelectric coupling forms the passband (or bandwidth) of LBAW filter 100. In some example, the frequency range is between 1.8 and 1.95 GHz. As discussed further below, the thicknesses and geometries, and spacing of the various layers of LBAW 100 can be tuned to change the RF response and passband of the filter.

A reflecting structure 130 can serve to isolate the vibration in piezo layer 110 from an underlying substrate 140 and to prevent acoustic leakage. Thin layer structure can, for example, be a Bragg reflector composed of alternating high and low acoustic impedance ("$Z_{ac}$") material layers. In some embodiments, the thickness of these layers can be designed such that the frequencies with and near the passband of LBAW filter are reflected back into piezo layer 110 and all other frequencies pass through the mirror.

In some embodiments, LBAW 100 does not directly overlie substrate 140 (as shown in FIG. 1A), but is self-supported, as shown in FIG. 1B. In such arrangement, substrate 140 and mirror 130 are replaced by an air gap, with portions of piezo that extend laterally past the region in which LBAW 100 is fabricated being supported by substrate 140.

In some embodiments, as shown in FIG. 1C, extensions 150*a* and 170*a* are rectangular and have a width W, length L, and are spaced by gap width G. Each electrode 150 and 170 has one or more extensions 150*a* and 170*a* respectively. The total number of electrode extensions is designated as K.

Although FIG. 1C shows rectangular interdigital electrodes 150/170 with parallel extensions 150*a*/170*a* of same geometry and spacing G, other electrode geometries are also contemplated. Design considerations include the gap between electrodes, the length of the electrode, and the number, if any, and shape of electrode extensions. The gap can be used to control coupling between the input and output electrodes. Longer electrodes can also increase coupling. The number of extensions K can be used to control the bandwidth and/or to increase coupling and to provide impedance matching. In some embodiments, the electrodes are composed of rectangular strips, with two or more extensions (e.g., $K \geq 2$). For example, each extension can be a rectangular strip. In some embodiments, the electrodes are concentric circles or spirals having a common axis.

Piezo layer 110 can be formed from various piezoelectric materials. Exemplary materials include ZnO, AlN, CdS, PZT, $LiNbO_3$, $LiTaO_3$, quartz, KNN, BST, GaN, Sc alloyed AlN, or the aforementioned materials doped or alloyed with an additional element. Doping can be used to improve or tailor electromechanical properties of piezo layer 110. As detailed further below, piezo layer thickness d is selected such that thickness-extensional modes near the frequencies of the desired bandwidth of the LBAW filter are produced in the piezo layer. In some embodiments, piezo layer thickness d is 20% to 50% of $\lambda_z$, or 30% to 45% of $\lambda_z$, where $\lambda_z$ is the wavelength of the piezoelectric vibration in the thickness direction. In some embodiments, d is 1500 nm to 2500 nm, or 1800 to 2200 nm.

Thin film IDT 102 can be composed of various materials. In some embodiments, IDT electrodes 150 and 170 are metal. For example, the electrode material includes Al, Mo, Pt, Cu, Au, Ag, Ti, W, Ir, Ru, or multilayers of metals and/or metals doped with additional materials, e.g. AlSi, AlSiCu, polysilicon, etc. Doping can be used to improve or tailor IDT electric or mechanical properties.

Although FIG. 1A shows a single common counter electrode 120, filter 100 can include separate electrodes for the input and output resonators. Various materials are suitable for the counter electrode(s) (e.g., electrode 120). For example, the electrodes can include a metal, such as Al, Mo, Pt, Cu, Au, Ag, Ti, W, Ir, Ru, or multilayers of metals and/or metals doped with additional materials, e.g. AlSi, AlSiCu etc. Doping can be used to improve or tailor IDT electric or mechanical properties. For example, the electrodes can be Ti+Mo, Ti+W, AlN+Mo, or Al+W. The electrodes can be multilayered. The electrodes can have a special thin seed layer deposited below the electrode.

Reflecting structure 130 can be composed of alternating layers of different materials. For example, reflecting structure 130 can include alternating layers of two of: Tungsten (W), $SiO_2$, silicon (Si), carbon (C). For example, layers of high acoustic impedance include be W, Mo, Ir, $Al_2O_3$, diamond, Pt, AlN, $Si_3N_4$. Layers of low acoustic impedance can include $SiO_2$, glass, Al, Ti, C, polymers, or porous materials. Layer of Si provides an intermediate acoustic impedance. Various materials are suitable for the substrate 140, such as Si or $SiO_2$ or glass, sapphire, quartz. Substrate 140 materials can have high electrical resistivity. The substrate can have a thickness appropriate for RF applications, such as integration into mobile phone platforms. For example, the substrate can have a thickness less than 500 microns, or less than 200 microns. For example, Si wafers can be purchased with a thickness of 675 μm and thinned down to achieve a desired device thickness, e.g., for mobile platforms.

Modeling of the acoustic response of LBAW 100 can provide guidance on how to tune the design parameters for individual elements of the structure to achieve desired bandpass properties. For example, LBAW 100 can be designed to have resonance modes at specific frequencies. In general, the geometry of various LBAW 100 components can be selected to achieve various acoustic properties. LBAW 100 properties can depend on the combination of these geometries, which may not be independent of one another.

Figure 2A:
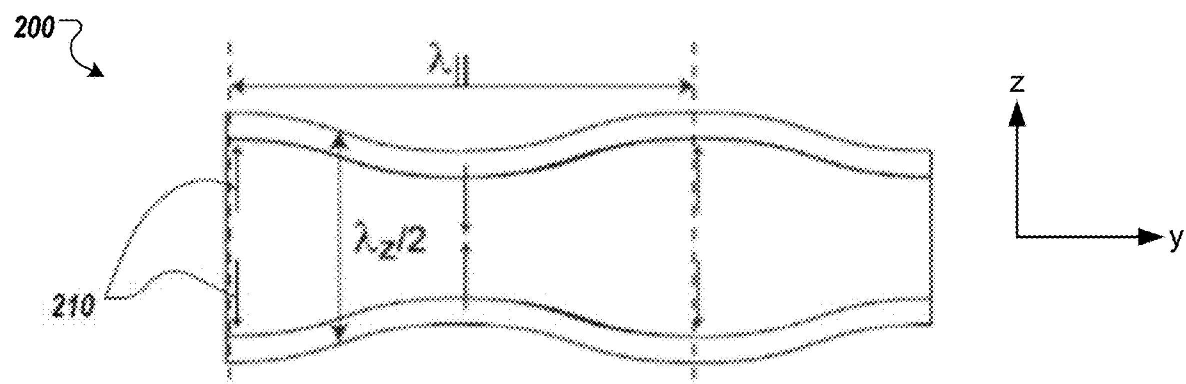
FIGS. 2A-B are schematic diagrams of two types of propagating plate wave modes in LBAW piezo layer.
Figure 2B:
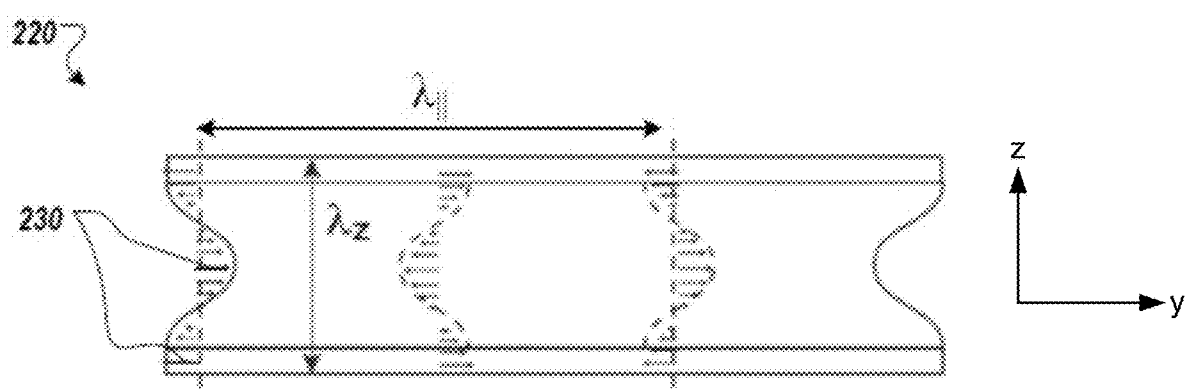

In piezoelectric layer 110, different bulk acoustic vibration modes can arise at different excitation frequencies f of input voltage (e.g., at port 160). Acoustic vibrations in piezo layer 110 can propagate laterally as Lamb waves (or plate waves), wherein particle motion lies in the plane that contains the direction of wave propagation and the plate normal (e.g., the z-axis in FIG. 1A). Two such modes are shown in FIGS. 2A-2B. Referring to FIG. 2A, a thickness-extensional (TE or longitudinal) bulk mode 200 has particle displacement 210 dominantly perpendicular to the propagation direction (in the z-direction). Referring to FIG. 2B, a second order thickness-shear (TS2) bulk mode 220 has particle displacement 230 dominantly parallel to the propagation direction (in the y-direction). For both modes, the lowest frequency at which resonance in the thickness direction can arise is when the thickness d of piezo layer 110 is equal to half wavelengths $\lambda_z$ (disregarding the thickness of electrodes 150/170); in other words, when $$d = \frac{N\lambda_z}{2},$$

the lowest resonance occurs when N=1 and higher harmonics follow where N is an integer greater than one. N indicates the order of the resonance. For the TE1 mode, $$d = \frac{\lambda_z}{2}.$$

As discussed further below, the width W of the electrodes and the gap G between electrodes can be designed such that TE1 mode standing waves with certain lateral wavelengths $\lambda_{\parallel}$ are formed that can couple through their evanescent tails across gap G to create two mechanical resonant modes.

Figure 3:
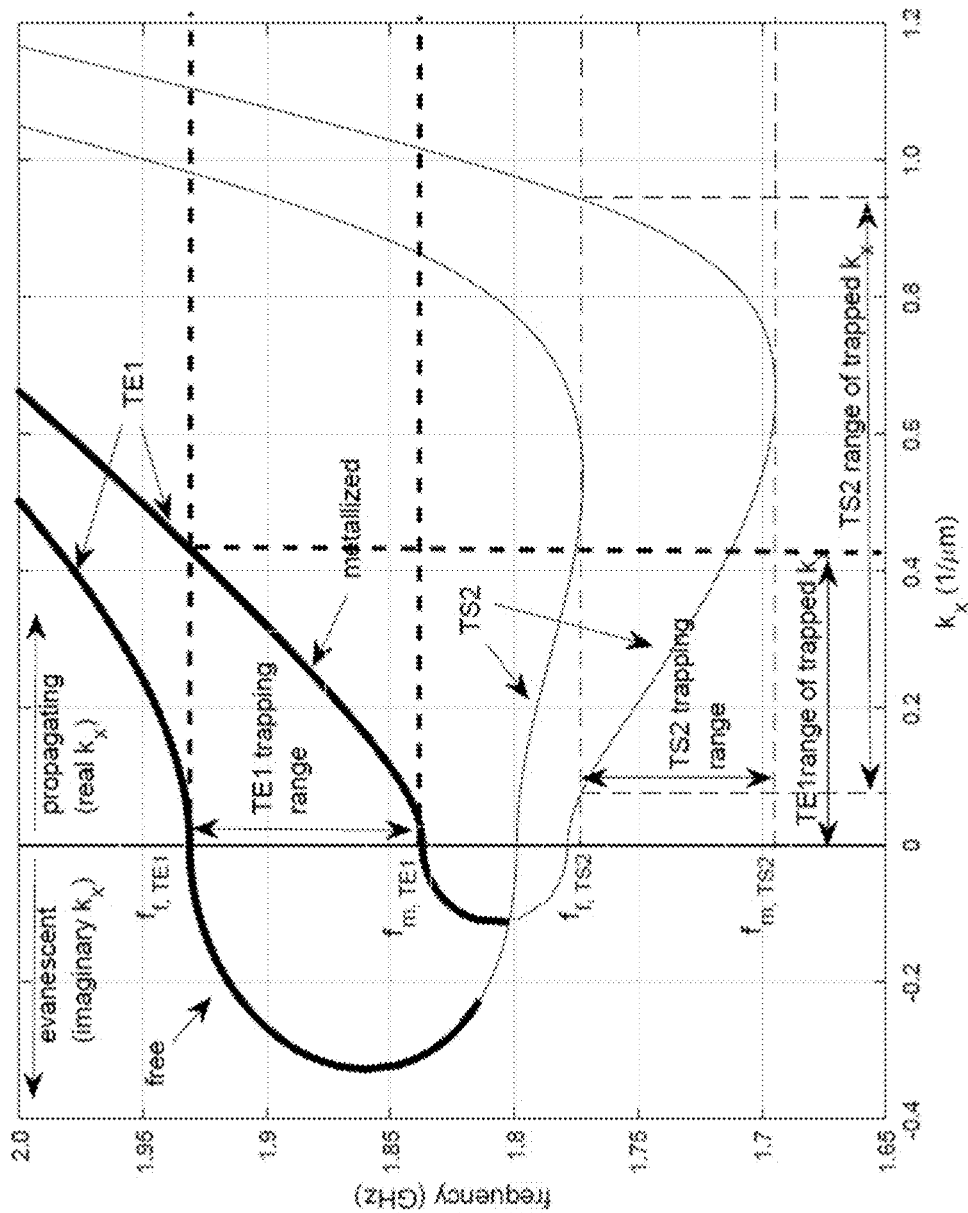
FIG. 3 is a dispersion curves for an exemplary LBAW.

Acoustic properties of an LBAW resonator 100 can be described with dispersion curves. Referring to FIG. 3, an example dispersion curve for an LBAW 100 shows the lateral wave number $k_{\parallel}$ (which is the wavenumber parallel to surface, and also referred to herein as "$k_x$") of the vibration, where $$k_{\parallel} = \frac{2\pi}{\lambda_{\parallel}},$$

as a function of voltage input frequency f. The first-order longitudinal (thickness extensional, TE1) vibration mode, in which the combined thickness of the piezoelectric layer d and the thickness of electrode(s) 150 or 170 contains approximately half a wavelength of the bulk vibration, $\lambda_z/2$, and the second-order thickness shear (TS2) mode, in which the bulk vibration is dominantly perpendicular to the thickness direction (z-axis in FIG. 2B) and one acoustic wavelength $\lambda_z$ is contained in the combined piezoelectric layer thickness d and the thickness of electrode(s) 150 and 170, are denoted in the figure. The TE1 mode is the darker portion of each dispersion curve, and TS2 mode is the lighter region of each dispersion curve. The top curve ("no electrode") represents the dispersion properties of the piezoelectric layer under the gap 190. The bottom curve ("metalized") represents the dispersion properties of the piezoelectric layer under electrodes 150/170, also known as the active region. More specifically, where the "metalized" curve intersects $k_x=0$, the TE1 mode has approximately $\lambda_z/2$ contained in the combined thickness of the electrodes 150 or 170 and the piezoelectric layer. This is approximate because the wave can extend into the Bragg reflector. The "No Electrode" curve intersection with $k_x=0$ lines shows the modes where approximately $\lambda_z/2$ is contained in the combined thickness of the bottom electrode only and the piezolayer. This type of dispersion, in which the TE1 mode has increasing $k_x$ with increasing frequency f, is called Type 1 dispersion. The difference in intersect $k_x=0$ frequencies between electrode and non-electrode areas determined the hard limits for the achievable bandwidth of the filter. The gap width G, electrode width W, and number of extensions K can be used to vary the coupling strength within the limits set by the dispersion difference.

In some embodiments, LBAW 100 can be designed to produce Type 1 dispersion. For example, piezo layer 100 materials can be selected in which Type 1 dispersion can occur. For example, ZnO can be used.

In another example, appropriate design of acoustic Bragg reflector 130 can help achieve Type 1 dispersion. For example, using Aluminum nitride ("AlN") for piezo layer 110 can typically produce a Type 2 dispersion, where TE1 mode behaves non-monotonically having initially decreasing $k_x$ with increasing frequency f, and then increasing $k_x$ with increasing frequency f, (roughly similar to what is described in the dispersion curves of in FIG. 3 but with TE1 and TS2 interchanged). However, in some embodiments, with an appropriate design of the reflecting structure 130 (e.g., acoustic Bragg reflectors), the LBAW 100 can use AlN in piezo layer 100 and still achieve a Type 1 dispersion. See for example Fattinger et al. "Optimization of acoustic dispersion for high performance thin film BAW resonators," Proc. IEEE International Ultrasonics Symposium, 2005, pp. 1175-1178.

In FIG. 3, positive values of $k_x$ denote real wave numbers (propagating waves) and negative $k_x$ values correspond to imaginary wave numbers (evanescent waves). For a resonance to arise, the acoustic energy must be trapped inside the LBAW resonator structure. In the thickness (z-axis) direction, isolation from the substrate (using reflecting structure 130) can be used for energy trapping. In the lateral direction, energy trapping can occur when an evanescent wave forms outside the "metalized" region (e.g., an electrode region), e.g., on the "free" or "no electrode" curve. To get resonant coupling between the two electrodes (e.g., electrodes 150/170 and 120) of an LBAW, standing waves of a TE1 mode form in the active regions of the piezo layer (under the electrodes), and evanescent waves form in the "free" region. In other words, $k_x$ is positive for the TE1 "metalized" curve and negative for the TE1 "free" curve. According to FIG. 3, this occurs in the labeled "trapping range" frequency range.

Energy trapping can be easier to realize in Type I dispersion. Without wishing to be bound by theory, with monotonically increasing dispersion curves as the thick TE1 lines in FIG. 3, for the "metalized", at a single frequency in the trapping range there is either a single imaginary wave number available or above the trapping range a single real wave number. The former means that the TE1 does not propagate outside the electrode, and the latter that the TE1 can couple to a propagating wave outside the electrode and thus "leak". The Type 2 dispersion can be described by similar curves but with the TE1 and TS2 curves interchanged. The fact that the curve in Type 2 is non-monotonic means that at a given frequency there may be several real wavenumbers. Having several wavenumbers for a frequency means propagating waves are available outside the electrode, which can cause a "leak". As will be described with respect to FIGS. 6-8, implementations of the present disclosure provide techniques to improve propagation of the TS2 resonance waves outside the metalized region.

Figure 4A:
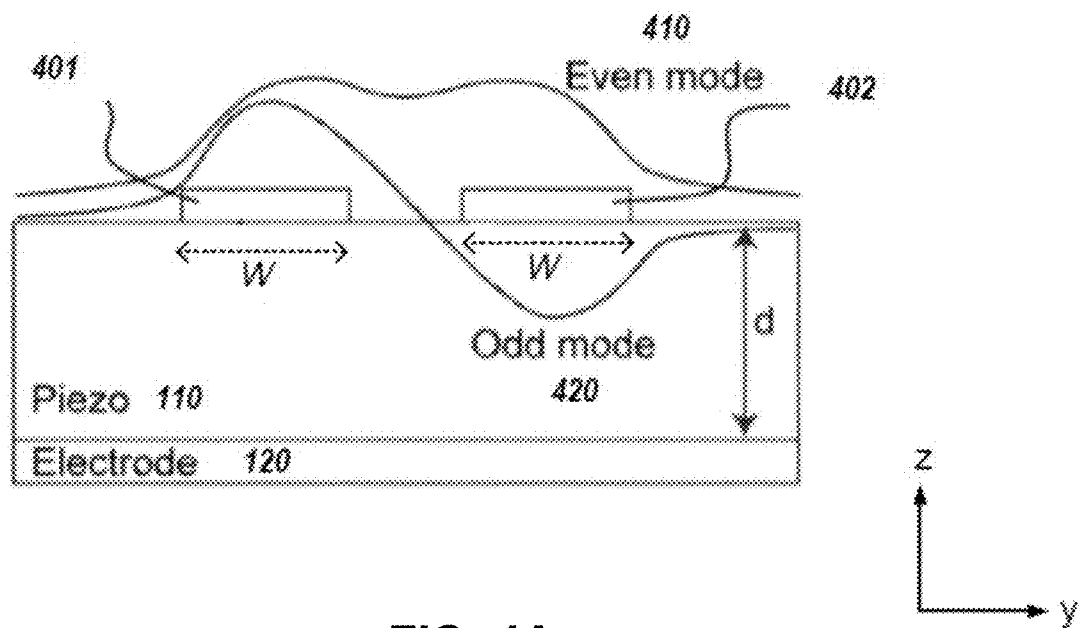
FIG. 4A is a schematic diagram of two resonant modes in an LBAW.
Figure 4B:
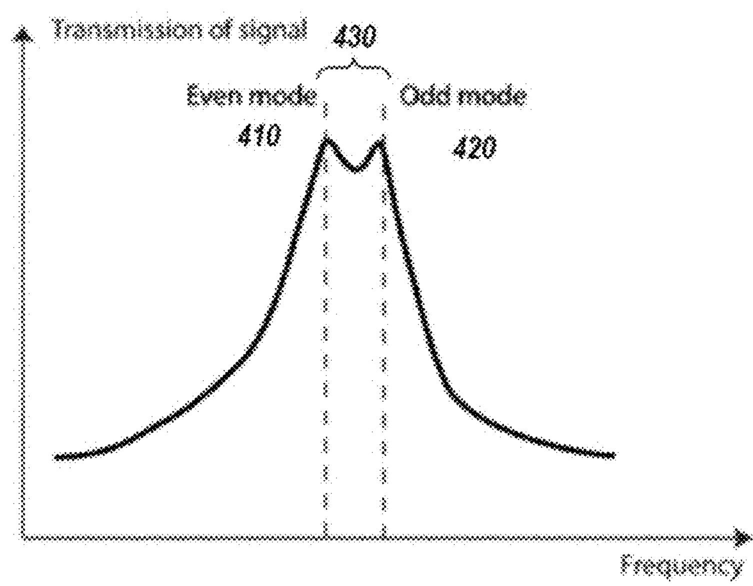
FIG. 4B is an illustrative transmission response of an LBAW as a function of frequency.

FIGS. 4A-4B illustrate the relationship between standing wave resonance modes and the LBAW bandgap. Referring to FIG. 4A, a portion of LBAW 100 includes two adjacent electrodes 401 and 402 with width W (e.g., corresponding to extensions **150*a* and 170*a* of respective electrodes 150 and 170 of FIG. 1A). The bandpass frequency response of LBAW 100 is formed by two (or more) laterally standing resonance modes, 410 and 420, arising in the structure. Lateral standing wave resonance can arise when plate waves are reflected from edges of electrodes 401 and 402. In the even mode resonance 410, the piezo layer under both electrodes 150 and 170 vibrates in-phase, whereas in the odd mode resonance 420**, the phases are opposite. The even lateral standing wave resonance can arise when the total width of the structure is roughly equal to half of the lateral wavelength $\lambda_{\parallel}$ of the mode:

$$\frac{\lambda_{even}}{2} = \frac{\lambda_{\parallel}}{2} \approx 2 \cdot W + G.$$

In the limit of infinitely small gap width G, $\lambda_{even}$ approaches the total width from below. As shown in FIG. 4A, $\lambda_{even}$ gets smaller when G gets larger and gets larger when G gets larger. In case of small gap (e.g., zero-gap) $\lambda_{even}$ gets close to 4W and in case of a large gap $\lambda_{even}$ gets close to 2W. The odd lateral standing wave resonance can arise when the width of the electrode is roughly equal to half of the lateral wavelength $\lambda_{\parallel}$ of the mode:

$$\frac{\lambda_{odd}}{2} = \frac{\lambda_{\parallel}}{2} \approx W.$$

Referring to FIG. 4B, the even 410 and odd 420 modes are shown as transmission peaks as a function of input frequency f for an LBAW with Type 1 dispersion. For Type 1 dispersion, even mode 410 has a longer wavelength and is lower in frequency than the shorter-wavelength odd mode 420. The frequency difference 430 between the modes determines the achievable bandwidth of LBAW filter 100, and depends on the acoustic properties of the structure and on the dimensions of IDT resonator 102. Acoustic coupling strength can be defined in terms of the (resonance) frequency difference between even (symmetric) and odd (antisymmetric) resonances:

$$\frac{f_{asymm} - f_{symm}}{f_0},$$

where $f_{symm}$ and $f_{asymm}$ are the symmetric and antisymmetric eigenfrequencies, respectively, and $f_0=(f_{symm}+f_{asymm})/2$ is the center frequency between the two modes.

In some embodiments, increasing the number of extensions (e.g., **150*a* and 170*a*) in each electrode (e.g., 150 and 170**) can increase the frequency difference between the even and odd mode in the LBAW, and thus increase the bandwidth. This effect can result from the fact that the lateral wavelength of the odd mode can depend on the periodicity of the electrode structure (e.g., width W), while the even mode can depend on the entire width of the structure (e.g., adding up all widths W and gaps G). For example, if the total number of electrode extensions K, the electrode width is W, and the gap width is G, the wavelength $\lambda_{\parallel}$ of the lateral acoustic wave at the even mode resonance frequency approaches or is slightly shorter than:

$$\frac{\lambda_{even}}{2} \approx K \cdot W + K \cdot G.$$

The odd lateral standing wave resonance in this structure, however, approaches or is slightly larger than:

$$\frac{\lambda_{odd}}{2} \approx W.$$

Additionally, or alternatively, in some embodiments, the total width of the structure K·W+K·G can be such that the highest-order mode trapped in the structure is the desired odd mode resonance. For example, K can be 31, W can be 3 and G can be 2 μm.

In some embodiments, the number of electrode extensions K is between 2 and 200, or between 10 and 60. In some embodiments, the length L of electrode extensions can be between 50 μm and 2000 μm, or between 70 μm and 500 μm.

In some embodiments, the gap G is selected to allow coupling of the evanescent tails of standing waves formed under electrodes 150 and 170. For example, the gap G between electrode extensions can be 0.1 μm and 10 μm, or between 2 μm and 5 μm.

In some embodiments, electrode 150 and 170 topology can be designed such that the gap width G provides good enough coupling between electrode extensions to create a single even mode 410 across the entire width of the structure. For example, the gap width G can be 2%-300%, or 10%-100% of the evanescent acoustic wave's decay length, i.e. the length at which amplitude $A=A_0 \cdot e^{-1}$ of the original amplitude $A_o$, in the gap at the desired even resonance mode. Gap with G can be optimized. Decreasing the gap to a too small width (1) can eventually pull the even and odd modes too far from each other creating a dip in the passband, (2) can lead to reduced coupling coefficient for the odd mode, or (3) can increase capacitive feedthrough from extension to extension causing poor stop band rejection (i.e., poor out of band attenuation).

In some embodiments, gap width G can be defined with respect to piezo layer thickness d. For example, G can be designed to be 10% to 300% of d, or 25% to 150% of d.

In some embodiments, the width of electrode extensions W can be between 0.1 μm and or between 2 μm and 5 μm. In some embodiments, W can be designed such that the wavelength $\lambda_{\parallel}$ of the lateral acoustic wave at the desired odd mode resonance frequency $\lambda_{odd}$ is obtained.

In some embodiments, electrode width W is designed such that multiple half-wavelengths cannot fit within the electrode width. For example, W can be designed to be smaller than the lateral acoustic wave's wavelength $\lambda_{\parallel}$ at the desired odd resonance mode, e.g., where $\lambda_{\parallel}=\lambda_{odd}$.

In some embodiments, the thicknesses of various LBAW 100 components can be selected to achieve various acoustic properties and may be interdependent. For example, the piezo layer 110 thickness d (minimum and maximum value) can first be determined with respect to the acoustic wavelength in the piezo material (λ) at the operation frequency f. In some embodiments, thicknesses (min and max) of the other LBAW 100 layers can be selected based on the choice of piezo thickness d. For example, the combined thickness of the electrodes (including the counter electrode 120) and the piezoelectric layer can be selected to be approximately half a wavelength of the mode that is being used, for example longitudinal bulk wave for the thickness extensional mode. Fundamental modes with N=1 (the first mode, i.e., first harmonic) can allow for greater coupling, but N>1 modes are also possible. For example, the thickness of electrodes 150 and 170, bottom electrode 120, and reflecting structure 130 can be defined as a percentage of piezo layer thickness d. In some embodiments, once all thickness are selected, the geometry of the electrode extensions **150*a* and 170*a*, such as number K, width W, gap G, and length L, can be tuned to match the LBAW 100** electrical impedance to the system impedance. Without wishing to be bound by theory, impedance matching can help avoid losses and reflections in the system.

In some embodiments, thickness of electrodes 150 and 170 is between 1% to 30% of d, or 2% to 25% of d, or 3% to 15% of d. In some embodiments, the thickness of bottom electrode 120 is between 5% to 50% of d, or 10% to 30% of d, or 10% to 20% of d.

In some embodiments, where the reflecting structure 130 is a Bragg reflector, the alternative layers of the reflector can be designed such that the required reflectivity of passband wavelengths is obtained. For example, the thickness of each layer can be equal to or less or more than one quarter of the acoustic wavelength $\lambda_z$ in the thickness direction to reflect the odd and even TE1 resonance modes. In some embodiments, a single layer in the Bragg reflector can be 15% to 80% of d, or 20% to 70% of d.

The mass loading of the IDT 102, determined by the thickness and material of electrodes 150 and 170, can be designed such that the frequency difference between the $k_{\parallel}=0$ frequency of the metalized region's TE1 mode and the outside metalized region's TS2 mode is small. Without wishing to be bound by any particular theory, when the frequency difference between outside region's TS2 mode and metalized region's TE1 mode is small, the trapping range is large. More particularly, the $k_{\parallel}=0$ frequency of the outside region's TS2 mode can be 95%-99% of the metalized region's TE1 cutoff frequency. The frequency difference between the outside region's TS2 and outside region's TE1 modes' $k_x=0$ frequencies is designed to be large, e.g. 5%-15%, for example 6.5-7.5%, of the metalized region's TE1 mode cutoff frequency.

According to certain embodiments of the present invention, the $k_x=0$ frequency of the outside region's TS2 mode is greater than, or equal to 98%, or between 98% and 99.5%, or is 98.9% of the metalized region's TE1 cutoff frequency. Similarly, the frequency distance expressed as the frequency difference between metalized region TE1 and outside region TS2 $k_{\parallel}=0$ frequencies:

$$\frac{\text{electrode } TE1 - \text{outside } TS2}{\text{outside } TS2}$$

should be small, for example on the order of 1%. As an example, said frequency distance can be between 0.2% and 2.1%, or between 0.5% and 1.8%, or between 0.8% and 1.5%, or for example, 1.1%.

Figure 5:
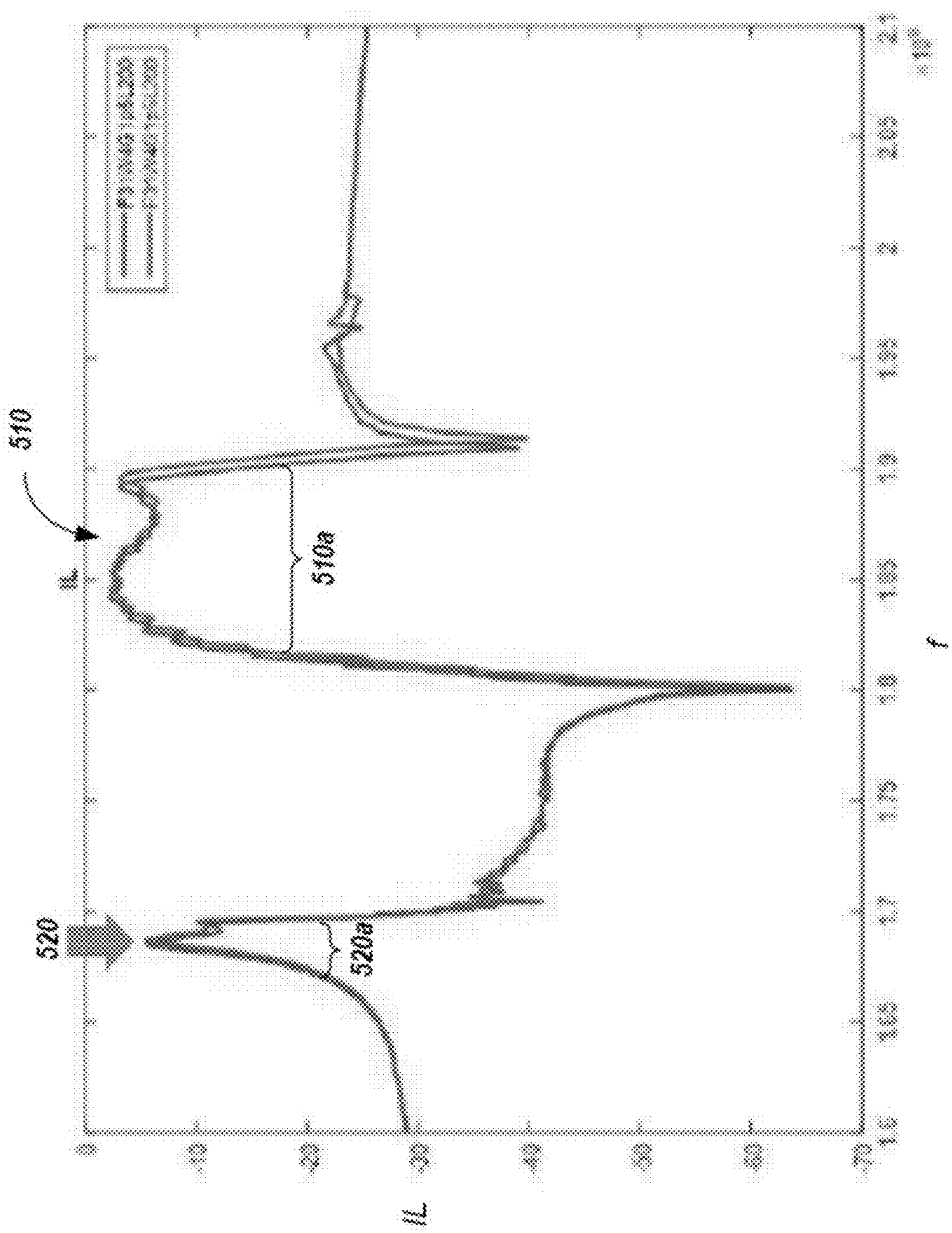
FIG. 5 is an experimental transmission curve of an LBAW as a function of frequency.

FIG. 5 shows a curve of insertion loss IL (in decibels) versus frequency f for an exemplary LBAW 100. The curve shows two passbands with peak 510 corresponding to TE1 waves and peak 520 corresponding to TS2 waves. As discussed above, the width of each passband is determined by the frequency difference of the even and odd modes for the respective type of wave. Here, the TS2 modes correspond to sideband 520*a* (also referred to herein as "TS2 passband"), and the TE1 modes correspond to passband 510*a* (also referred to herein as "TE1 passband"). In some embodiments, LBAW 100 is designed to suppress peak 520 corresponding to TS2 modes, while maintaining the properties of peak 510 corresponding to TE1 modes. Without wishing to be bound by any particular theory, TE1 mode operation can be selected because piezo thin film materials have electromechanical coupling that is stronger in the thickness direction. In other words, TE1 longitudinal mode vibrations couple more efficiently to the electrical excitation over the thickness of piezo layer 110.

In some embodiments, LBAW 100 can be designed to have a passband for TE1 modes between 0.5 and 10 GHz, or between 1 and 4 GHz. In some examples, TE1 passband is between 1.8 and 3.7 GHz. The limits of the passband can incorporate design considerations. For example, the dimensions of the device can grow very large or very small. Too large dimensions may take too much space and cause inefficiencies. Too small dimensions can deteriorate performance due to thin and narrow electrodes leading to resistance and losses. In some embodiments, LBAW 100 can be designed to have a TE1 passband width 510*a* of 0.5-15% relative to center frequency, e.g., 10% relative to center frequency, or 5%, or 2%, or 1%. In some embodiments, the insertion loss at the passband is better than −7 dB, e.g., −7 dB to −0.5 dB or −5 dB to −0.5 dB.

LBAWs can be used as band pass filters. The IDT electrodes of an LBAW can be designed to couple a driving electrical signal to a desired fundamental TE1 mode. An effective coupling results in a passband similar to the TE1 passband of 510*a* in FIG. 5. However, the coupling also results in one or more sidebands similar to the sideband 520*a*. The sideband 520*a* can be at a lower frequency than passband 510*a*, and can be narrower than the passband 510*a*. The sideband 520*a* is generated because of electric field between the parallel extensions (e.g., the extensions 150*a* and 170*a*) of LBAW. The extensions cause an asymmetrical electric field in the thickness direction of the piezo, and the asymmetrical electric field couples to both the TE1 and TS2 modes.

Implementations of the present disclosure provides techniques to suppress the sideband created by the TS2 mode based on the structure of the LBAW filter's components. An appropriate selection of the thickness of one or more reflecting layers relative to extensional mode (longitudinal) acoustic wavelength at the center frequency of the pass-band filter can improve suppression of parasitic sidebands. The longitudinal wavelength is a longitudinal bulk wave velocity of the material of the reflecting layer divided by the frequency. An appropriate selection of the thickness of one or more reflecting layers relative to the thickness of the piezoelectric layer 110 can improve suppression of the parasitic sideband 520*a*. As explained in further details below, selecting proper thicknesses for the layers would cause the TS2 modes to leak outside the IDT region into the area of the piezoelectric layer that is not covered by the IDT. Such leakage would reduce the TS2 energy confined in the IDT region and suppress the TS2 mode's sideband.

Figure 6A:
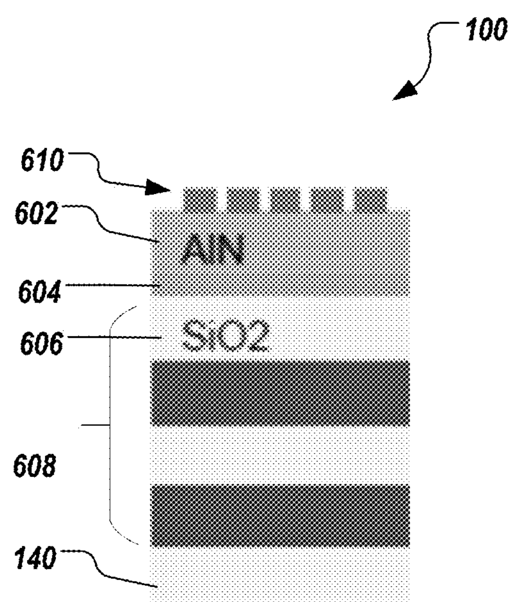
FIGS. 6A and 6B illustrate a cross sectional view of the LBAW filter of FIG. 1A.

FIG. 6A illustrates a cross sectional view of the LBAW filter 100. For simplification, only a portion of the LBAW filter 100 is illustrated. The cross sectional view depicts a conductive layer 610, a piezoelectric layer 602, for example, made of AlN, a counter electrode 604, and a reflecting structure 608. The reflecting structure 608 includes a topmost reflecting layer 606. The conductive layer 610 can provide either of the electrodes 150 and 170 in FIG. 1A, the piezoelectric layer 602 can provide the piezoelectric layer 110 in FIG. 1A, the counter electrode 604 can provide the electrode 130 in FIG. 1A, and reflecting structure 608 can provide the reflecting structure 130 in FIG. 1A.

The topmost reflecting layer 606 is made of a low impedance material such as $SiO_2$. In the illustrated embodiment, the topmost reflecting layer 606 is in direct contact with a bottom surface of the counter electrode 604. In some implementations, the thickness of the topmost reflecting layer 606 is selected with respect to the extensional mode (longitudinal) acoustic wavelength at the center frequency of the filter pass-band. For example the topmost reflecting layer can be 30% to 47% of the wavelength of the center frequency. In some implementations, the topmost layer's thickness is between 1000 nm to 1500 nm (e.g., 1100 nm to 1400 nm, or 1300 nm to 1400 nm). In some implementations, at least one of the reflecting layers (e.g., the topmost reflecting layer) is at least 20% (e.g., at least 40%) thicker than a quarter of a longitudinal acoustic wavelength at the LBAW's center frequency in the reflecting layer.

Figure 6B:
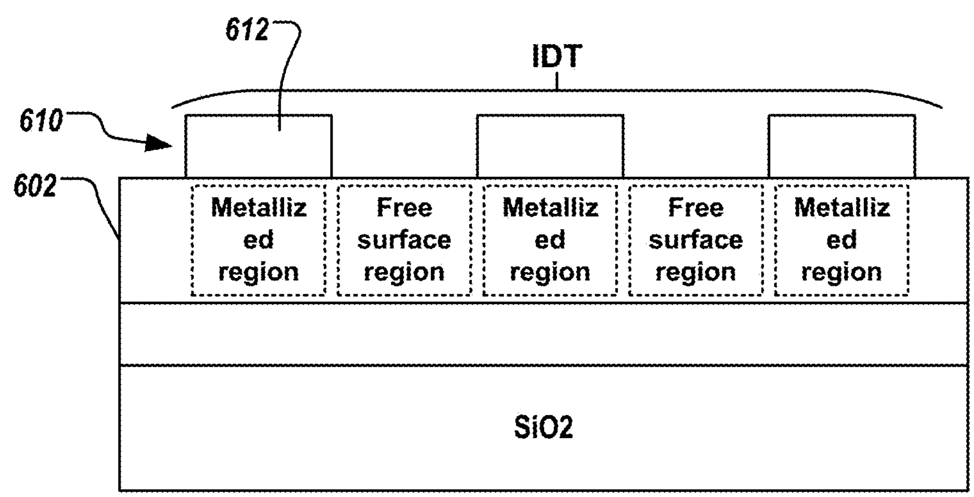

As explained above with respect to FIG. 3, for a resonance to arise, the acoustic energy must be trapped inside the LBAW resonator structure, which means in a range of frequency where $k_x$ is positive for the "metalized" curve and negative or non-existing for the "free" curve (see FIG. 3 depicting a trapping range). For TE1 and TS2 modes, energy trapping occurs below the lowest frequency of the free surface (i.e., no electrode) dispersion curve with positive $k_x$ ($f_f$) and above the lowest frequency of the metallized dispersion curve with positive $k_x$ ($f_m$). Within this frequency range, the mode can propagate in the metallized region of the piezoelectric layer (also referred to as the "metallized region" herein), but not in the free surface region of the piezoelectric layer (also referred to as the "free surface region" herein). Hence, the mode energy is confined within the metallized region resulting in low losses. Above the frequency $f_f$, the energy leaks out from the metallized region, causing loss. FIG. 6B depicts metallized and free space regions in a portion of the piezoelectric layer 602. The conductive layer 610 includes multiple extensions 612 of an IDT. The extensions can be the extensions 150*a*, 170*a* in FIG. 1A.

By selecting proper layer thicknesses, the $f_f$ and $f_m$ frequencies can be brought closer to each other for the TS2 mode so that the TS2 mode would not be trapped or would be trapped for only a small frequency range. For example, the resulted frequency range can be 5%, 2% or less than 2% of the filter's center frequency, 5%, 2%, or less than 2% of the $f_m$, or over a particular frequency (e.g., over 0.2 GHz). Similarly, the thicknesses can be designed so that a majority of the TS2 mode's energy be propagated out of the metalized region and into the free surface region (rather than being trapped in the metalized region.)

FIGS. 7A1 and 7B1 provide an example where increasing the thickness of the topmost reflecting layer reduces the difference between $f_f$ and $f_m$ and results in leakage of the TS2 mode at lower frequencies. FIG. 7A1 presents dispersion curves of a first LBAW filter, and FIG. 7B1 presents dispersion curves of a second LBAW filter. The dispersion curves are depicted as x-component of wavevector ($k_x$, horizontal component or component parallel to the surface) for different frequencies. The first and the second LBAW filter are identical, except that the topmost reflecting layer 606 in the second LBAW filter is thicker than the same layer in the first LBAW filter. FIG. 7A2 provides more details of FIG. 7A1. FIG. 7B2 provides more details of FIG. 7B1.

In FIGS. 7A1-7A2 and 7B1-7B2, lines 702*a* and 712*a* present dispersion curves for the TE1 mode in the free surface region, and lines 702*b* and 712*b* present dispersion curves for the TE1 mode in the metalized regions. Lines 704*a* and 714*a* present dispersion curves for the TS2 mode in free surface, and lines 704*b* and 714*b* present dispersion curves for the TS2 mode in the metalized regions (specifically, the piezoelectric layer's area that is covered by the IDT).

As illustrated, the TS2 dispersion curve for the first LBAW in FIG. 7A1 is of type II for $k_x$ values below $0.6\times10^6$ l/m, while the dispersion curve for the second LBAW in FIG. 7B1 is of type I for all $k_x$ values. Accordingly, TS2 is less likely to be trapped in the metalized region of the second LBAW as compared to the metalized region of the first LBAW, or may be trapped for relatively lower frequencies in the second LBAW as compared to the first LBAW. More specifically, in the second LBAW the TS2 may become trapped in a narrower frequency range than in the first LBAW.

The TS2 can propagate in the free and metalized regions with lateral wavelengths of over 5 times (e.g., over 9 times for the example LBAW filter of FIGS. 7A1, 7B1) the thickness of the piezoelectric layer. The TS2 can propagate in the free and the metalized regains with lateral wavelength of over 2 times (e.g., over 2.5 or over 2.9 times for the example LBAW filter of FIGS. 7A1, 7B1) the longitudinal acoustic wavelength of the piezolayer at the center frequency of the filter.

The behavior of the parasitic TS2 sideband can be attributed to the trapped TS2 mode energy, which depends on the frequency differences between the dispersion curves in the metalized and the free space regions. Looking at the dispersion curves for TS2 mode for the first LBAW (FIG. 7A1), one can see that the frequency difference between the dispersion curves of the metalized region 704*b* and the free surface 704*a* (at least initially) increase with $k_x$. This is because for the metallized region the dispersion is of type II, and for free surface region the dispersion is of type I. However, the dispersion curve for TS2 mode in the second LBAW (FIG. 7B1) is of type I for both the metalized and the free surface regions, and the frequency difference between the dispersion curves of the metalized region 714*b* and the free surface region 714*a* in the second LBAW is much smaller than the frequency difference in the first LBAW. This results in trapping the TS2 mode in a relatively smaller frequency range in the second LBAW as compared to the first LBAW.

A low wavelength (high $k_x$) for the $f_{f,TS2}$ frequency, would limit the IDT period (2W+2G in FIG. 1C) of the electrode extensions that could be designed for suppressing the TS2 sideband. For better TS2 sideband suppression, it is preferred to have IDT period smaller than the wavelength of the $f_{f,TS2}$ frequency. The $k_x$ value above which the TS2 mode leaks out from the metalized region in the first LBAW (FIG. 7A) is approximately $0.96\times10^6$ l/m (which is the kx at $f=f_{f,TS2}$ and corresponds to wavelength 6.5 μm). This means that if the electrode structure couples reasonably well to TS2 mode with wavelength larger than 6.5 μm, the energy trapping causes a strong (i.e., wide passband and/or high peak) TS2 sideband. In the second LBAW (FIG. 7B), the $k_x$ value above which the TS2 mode leaks out from the metalized region is approximately $0.37\times10^6$ l/m (corresponding to wavelength 17 μm). This means that the TS2 mode starts leaking at a much lower frequency and much higher wavelength in the second LBAW than it does in the first LBAW. Ideally the period of the IDT is smaller than the wavelength at $f_{f,TS2}$ and larger than the wavelength at $f_{f,TE1}$.

Figure 7C:
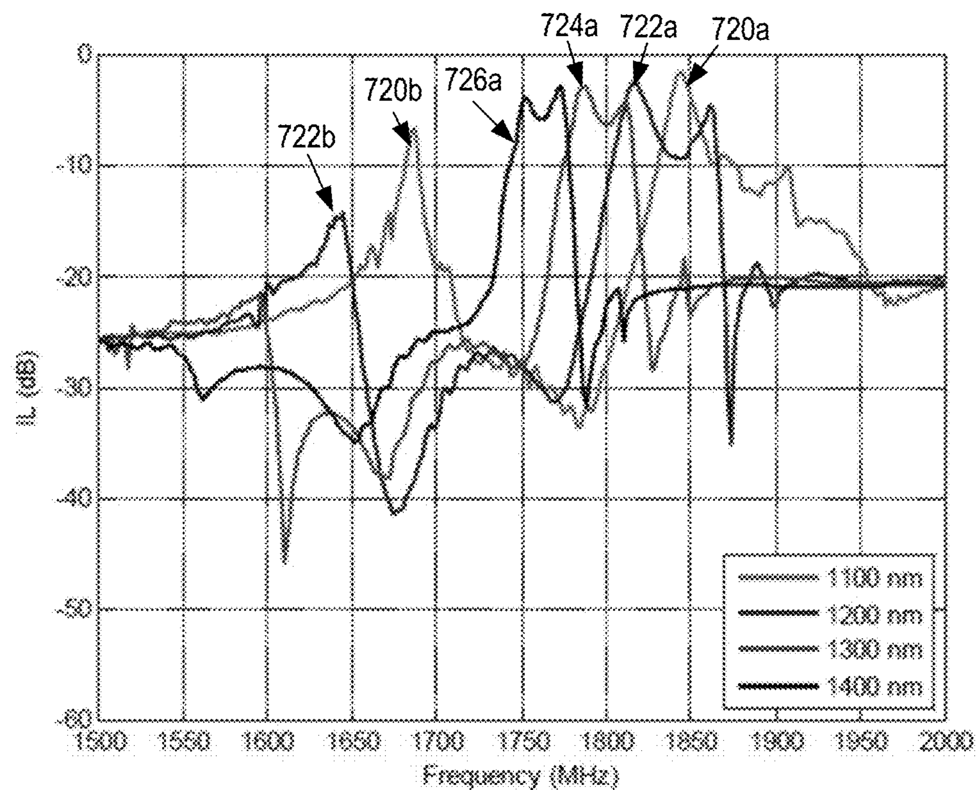
FIGS. 7C and 7D depict insertion losses for multiple example LBAW filters with different reflecting layer thicknesses.

To give more examples, the plots illustrated in FIG. 7C depict insertion loss as a function of frequency for LBAW filters that differ only in thickness of their topmost reflecting layer (i.e., the first reflecting layer 606). The four insertion losses depicted in FIG. 7C are associated with four similar LBAW filters that differ only in thickness of their topmost reflecting layer. The passbands 720*a*, 722*a*, 724*a*, and 726*a* are associated with LBAW filters with topmost reflecting layer of 1100 nm, 1200 nm, 1300 nm, and 1400 nm, respectively.

As illustrated, as the thickness increases, the TE1 passband shape is improved: passband boundary is more clear, the passband width is reduced, and the center frequency is decreased. Also, as the thickness increases, frequency of the parasitic TS2 sideband is reduced and the parasitic sideband is suppressed more effectively. For example, while a peak of the parasitic sideband 720*b* associated with the LBAW that has the thinnest topmost reflecting layer (i.e., 1100 nm) is comparable to the passband 720*a* of the same LBAW, the peak of the parasitic sideband 722*b* associated with the LBAW having a topmost reflecting layer of intermediate thickness (i.e., 1200 nm) is lower, and the parasitic sideband of the LBAW that has the thickest topmost reflecting layer (i.e., 1400 nm) is almost unrecognizable.

Other than layer thicknesses, structures of the electrodes can also affect suppression of the TS2 mode sideband. For example, as noted above, the TS2 mode starts leaking at $k_x=0.96\times10^6$ l/m, i.e. at wavelength of about at 6.5 μm in the first LBAW filter of FIG. 7A, while it starts leaking at $k_x=0.37\times10^6$ l/m, i.e. at wavelength of about 17 μm in the second LBAW filter of FIG. 7B (which has a thicker topmost reflecting layer). This means that for electrode periods (2W+2G in FIG. 1C) lower than 17 μm (e.g., less than 11 μm), the TS2 is not trapped into the metalized region. Thus, a thicker reflecting layer provides the opportunity of using a wider range of electrode extension and gap widths and achieving comparable TS2 mode suppression.

Figure 7D:
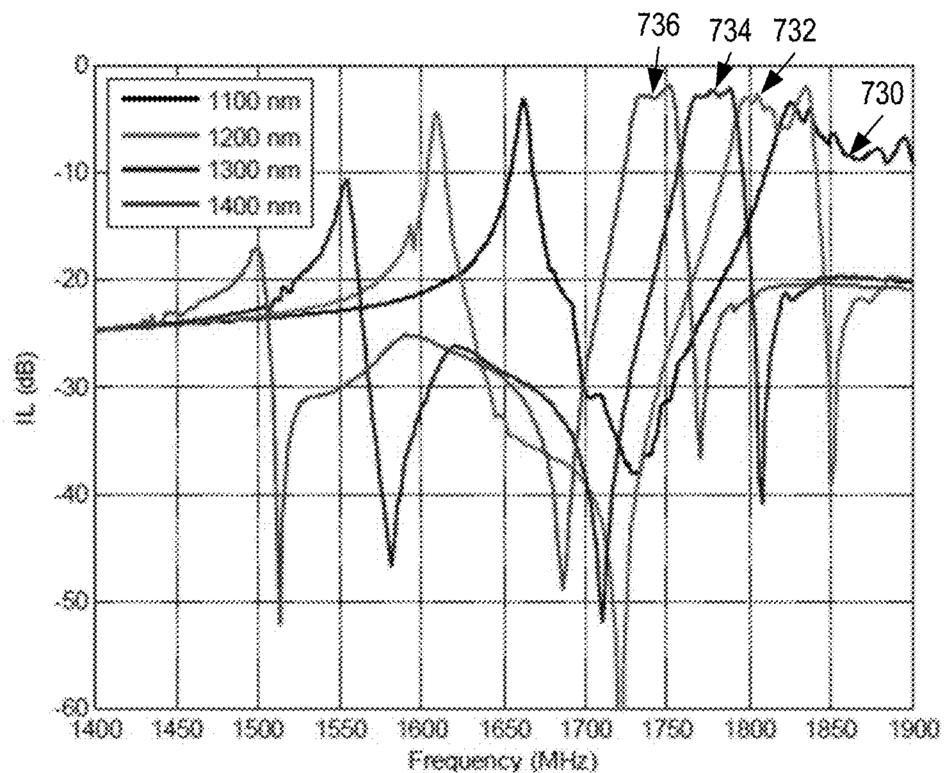

FIG. 7D provides example insertion losses for LBAW filters similar to the LBAW filters of FIG. 7C, but with wider electrodes. Plots 730, 732, 734, and 736, depict insertion loss for LBAW filters with a topmost reflecting layer of 1100 nm, 1200 nm, 1300 nm, and 1400 nm, respectively. Comparing FIG. 7D to FIG. 7C, one can see that narrowing the electrode width (W) improves suppression of the TS2 mode sideband.

Figure 8A:
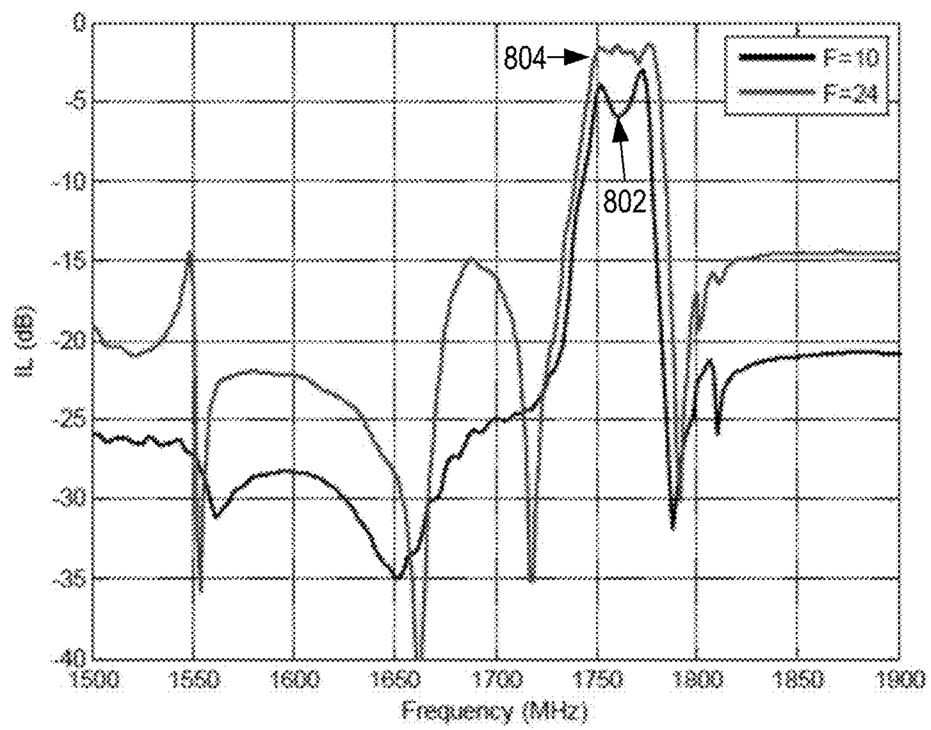
FIGS. 8A and 8B depict inversion losses for example LBAW filters with different numbers of extensions.

The number of extensions in the electrodes plays a role in the LBAW's insertion loss and in suppressing the TS2 mode sideband, as well. FIG. 8A depicts insertion loss of two similar LBAW filters that have different number of extensions. Plot 802 is insertion loss for a first LBAW with 10 extensions, while plot 804 is the insertion loss for a second LBAW with 24 extensions.

As illustrated in FIG. 8A, increasing the number of extensions increases main passband width and improves the passband shape. However, increasing the number of extensions also strengthens the parasitic TS2 sideband. This can be because of internal reflections of TS2 mode within the IDT that cause the energy of the TS2 mode to be better confined within the metalized region. Even in a case where a mode is not trapped and may propagate along the free surface, the discontinuity at the interface of the metallized area and free surface can cause a finite reflection of a wave incident on the interface. Generally, the larger the discontinuity (in terms of height in z direction e.g., in FIG. 1 or in terms of difference in $f_m$ and $f_f$, as a larger height causes a larger difference between $f_m$ and $f_f$), the larger the reflection is.

In addition, stop band rejection decreases with increasing number of extensions because the total capacitance between input and output extensions increases correspondingly. Accordingly, the number of extensions can be selected so that the energy confinement and the capacitance effect of the IDT are reduced. For example, the number of extensions for each of the electrodes 150 and 170 can be less than 50, for example, between 4 to 40 extensions or 10 to 31 extensions.

Also, the longer the IDT is the more TS2 mode energy is confined. The length of the extensions can be selected to be less than 350 μm, for example, 350 μm.

The negative effects that an increased number of extensions would cause can be reduced by manipulating the extensions' structure and the gap 190 (G in FIG. 1C) between the extensions. For example, decreasing the gap widens the main passband. Decreasing the extension width W decreases the wavelength at the antisymmetric mode resonance frequency and, consequently, increases $k_x$. Such a decrease in the wavelength moves the frequency of the antisymmetric mode closer to the frequency $f_{m,TE1}$ above which TE1 mode propagates in the non-metallized region. The decrease in the wavelength also make the TS2 mode to radiate energy more efficiently in lateral direction and, hence, improves the suppression of the TS2 mode resonance peak.

Figure 8B:
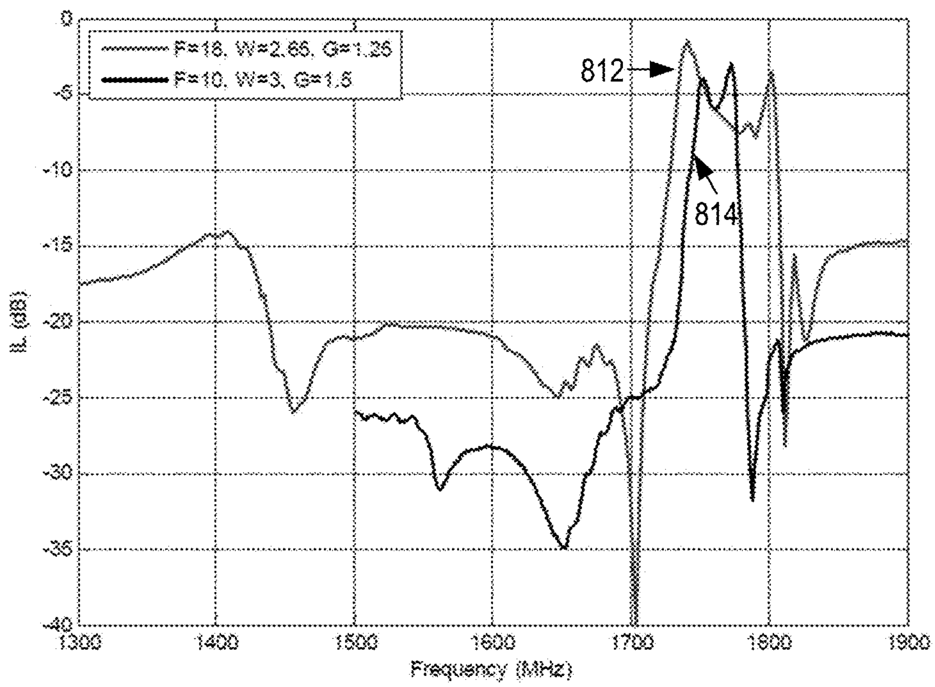

Combining these features (i.e., a decrease in the gap G and a narrower extension width W) with the number of extensions would provide an improved passband. For example, FIG. 8B illustrates two insertion losses for a first and a second LBAW filter. The two LBAW filters are similar, except that the first filter has a wider electrode, a narrower gap, and a more number of extensions than the second filter.

Plot 812 depicts the insertion loss of the first LBAW filter, and plot 814 depicts the insertion loss of the second LBAW filter. As illustrated, the first filter has a significantly wider main passband. Even though the first filter has a higher number of extensions than second filter, the strength of the TS2 parasitic sideband in the first filter is not significantly higher than in the second filter. Thus, a wide passband and a well suppressed TS2 parasitic sideband can be achieved by properly designing the structure of the electrodes and the number of extensions.

The configuration of the input and the output electrodes' extensions can also affect the suppression of the TS2 mode sideband. The electrodes 150 and 170 of the IDT depicted in FIG. 1A are integrated such that each extension 150*a* is located between two adjacent extensions 170*a*. To reduce the internal reflections within the IDT one can use a split extensions configuration. In a split extensions configuration, multiple extensions 150*a* of the input electrode 150 would be positioned between two adjacent extensions 170*a* of the output electrode 170. For example, moving on the surface of the piezoelectric layer and across the extensions, a first two extensions can be connected to a driving potential, the next two extensions can be grounded, the next two extensions can be connected to the driving potential, and so on.

Figures 9A, 9B, 9C:
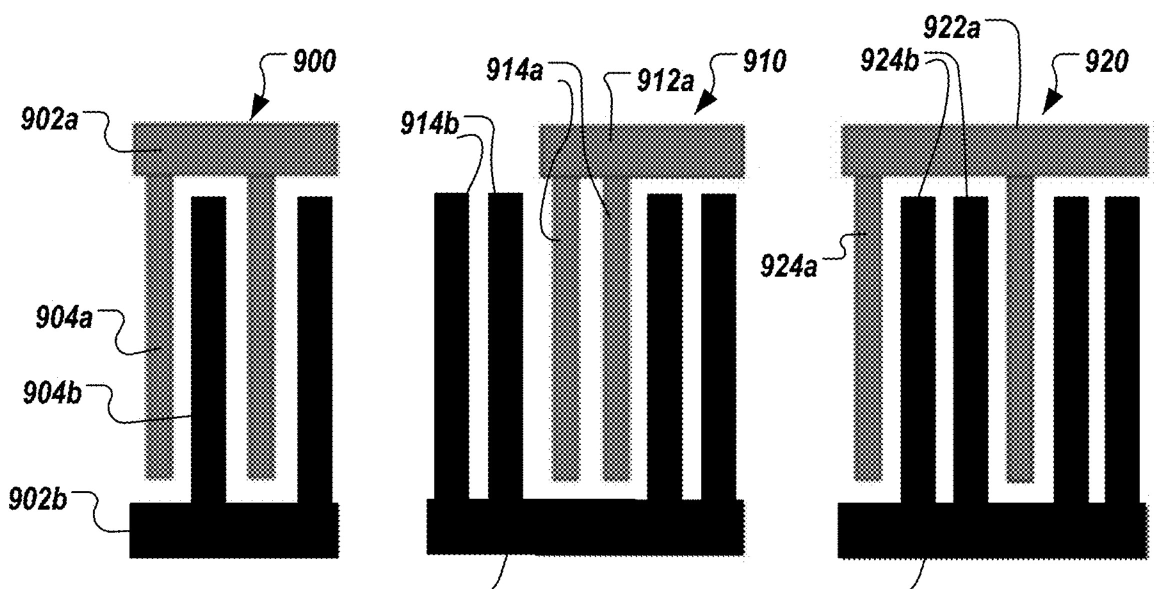
FIGS. 9A, 9B and 9C illustrates example IDTs with normal and split extensions configurations.

FIGS. 9A, 9B and 9C illustrate portions of example IDTs 900, 910, and 920. Referring to FIG. 9A, IDT 900 has a 1:1 pattern, where extensions 904*a*, 904*b* of the two electrodes 902*a*, 902*b*, respectively, are alternatingly located between each other. Referring to FIG. 9C, IDT 920 has a 2:1 pattern, where (excepting ends of the array) every extension 924*a* of a first electrode 924*a* is located between two adjacent extensions 924*b* of a second electrode 924*b*. The first electrode 922*a* can be the input electrode and the second electrode 922*b* can be the output electrode, or vice versa. Referring to FIG. 9B, IDT 910 has a 2:2 pattern, where (excepting ends of the array) every two extensions 914*a* of a first electrode 912*a* are located between adjacent groups of two extensions 914*b* of the second electrode 912*b*.

In some implementations, the arrangement of the extensions has a pattern that is periodically repeated on the surface of the piezoelectric layer. For example, the patterns shown in IDT 910 or 920 can be repeated on the piezoelectric layer 110 to form the input and the output electrodes of an LBAW filter. A pattern can include any number or ratio of extensions (e.g., 1:3, 2:3, 3:3, etc.).

Similar to a 1:1 IDT, in an LBAW with a split extension configuration the parasitic TS2 sideband weakens with an increase of the thickness of the topmost reflecting layer. Also, in a split extension configuration, the LBAW's main passband gets wider as the number of extensions are increased. Compared to an LBAW with 1:1 IDT, the less ripple may appear on the passband in a split extension configuration. However, the out-of-band rejection level in the split extension configuration is better than the out-of-band rejection level in the 1:1 IDT because the total capacitance between the input and the output extensions is smaller (e.g., 1%-5% or 2%-3% smaller) in the split extension configuration than in similar but non-split-extension configurations. Also, in a split extension IDT, relative strength of parasitic TS2 sideband may not significantly increase when the number of extensions is increased. This can be because the split-extension IDT has less internal reflections than a normal 1:1 IDT does. The internal reflections in the normal 1:1 IDT causes a stronger confinement of the TS2 mode into the IDT and consequently, a stronger TS2 parasitic sideband.

Figure 10:
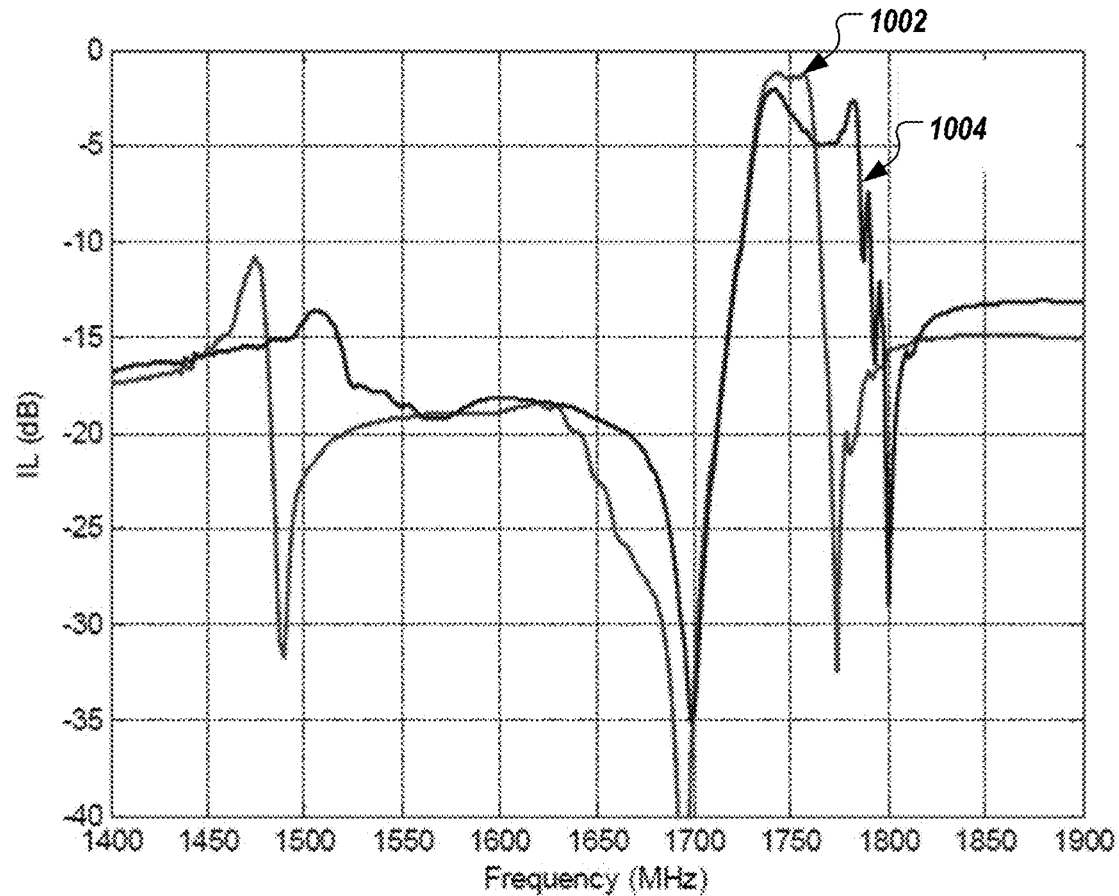
FIG. 10 depicts insertion loss for two example LBAW filters with different split extensions IDT patterns.

FIG. 10 illustrates insertion loss of two LBAW filters with split extension IDTs. Plot 1002 is the insertion loss of a first LBAW filter with a 2:2 IDT, while plot 1004 is the insertion loss of a second LBAW filter with a 2:1 IDT pattern. In this example, the passband width is larger and the parasitic TS2 passband is weaker for the second LBAW filter with the 2:1 IDS pattern as compared to the first LBAW filter. This difference is at least partly due to a weaker coupling of the TS2 mode to the driving electric potential in the 2:1 extension pattern as compared to the 1:1 pattern.

A number of implementations have been described. Nevertheless, it will be understood that various modifications may be made without departing from the spirit and scope of disclosure. For example, the implementations can be used in a variety of micro-acoustic resonators including, but not limited to BAW, LBAW, and SAW resonators, Lamb wave devices, and guided wave devices. Accordingly, other implementations are within the scope of the following claims.

What is claimed is:

1. An acoustic wave filter device comprising:

an acoustic wave resonator that includes an input port including a first electrode and a counter electrode, a piezoelectric layer sandwiched between the first electrode and the counter electrode such that application of a radio frequency voltage between the first electrode and the counter electrode creates acoustic resonance waves in the piezoelectric layer, the acoustic resonance waves comprising acoustic thickness-extensional resonance modes and one or more acoustic thickness-shear resonance modes, and an output port, wherein the piezoelectric layer has a first region covered by the first electrode or by the output port, and a second region not covered by any of the first electrode and the output port, and wherein the first region has a second order acoustic thickness-shear resonance (TS2) mode dispersion curve with a first minimum frequency ($f_m$), and the second region has a TS2 mode dispersion curve with a second minimum frequency ($f_f$); and a reflecting structure located below the acoustic wave resonator and comprising at least a first reflecting layer, wherein the first and the second minimum frequencies depend on a thickness of the first reflecting layer, wherein the thickness of the first reflecting layer is such that a difference between the first minimum frequency and the second minimum frequency is less than 2% of the first minimum frequency, the thickness being measured in a direction perpendicular to surface of the acoustic wave resonator.

2. The acoustic wave filter device of claim 1, wherein the first reflecting layer is at least 40% thicker than a quarter of a longitudinal acoustic wavelength at a filter center frequency of the acoustic wave filter.

3. The acoustic wave filter device of claim 1, wherein the TS2 propagates in the first and the second regions with lateral wavelengths of over 9 times a thickness of the piezoelectric layer.

4. The acoustic wave filter device of claim 1, wherein the output port has an output electrode, and wherein each of the first electrode and the output electrode has a comb-shaped structure with a plurality of extensions, multiple extensions of the first electrode are interdigitated with multiple extensions of the output electrode.

5. The acoustic wave filter device of claim 4, wherein each extension has a width smaller than a wavelength associated with the first minimum frequency, the width of an extension being perpendicular to a length of the extension on the piezoelectric layer.

6. The acoustic wave filter device of claim 4, wherein the first electrode and the output electrode, in total, have 4 to 40 extensions.

7. The acoustic wave filter device of claim 1, wherein the first reflecting layer of the reflecting structure is in direct contact with a bottom surface of the acoustic wave resonator.

8. The acoustic wave filter device of claim 1, wherein the reflecting structure includes a Bragg reflector, the Bragg reflector comprising multiple layers with alternating high and low acoustic impedance materials, wherein a low acoustic impedance is lower than a high acoustic impedance.

9. The acoustic wave filter device of claim 8, wherein the first reflecting layer is a topmost layer of the Bragg reflector.

10. The acoustic wave filter device of claim 1, wherein the first reflecting layer comprises SiO2.

11. The acoustic wave filter device of claim 1, wherein the first electrode has an integrated geometry with an output electrode of the output port.

12. The acoustic wave filter device of claim 1, wherein the thickness of the first reflecting layer is between 1100 nm to 1400 nm.

13. The acoustic wave filter of claim 1, wherein the first electrode has a first comb-shaped structure with a plurality of input extensions, and the output port has an output electrode having a second comb-shaped structure with a plurality of output extensions, and wherein the plurality of input extensions and the plurality of output extensions form a pattern that is periodically repeated on a top surface of the piezoelectric layer, a period of the pattern including a first number of input extensions immediately followed by a second number of output extensions, wherein at least one of the first and the second numbers is greater than 1.

14. The acoustic wave filter device of claim 13, wherein the second number is 2.

15. The acoustic wave filter device of claim 14, wherein the first number is 1.

16. The acoustic wave filter device of claim 13, wherein the input extensions and the output extensions are formed as an array of parallel extensions.

17. The acoustic wave filter device of claim 13, further comprising a Bragg reflector located below the counter electrode.

18. The acoustic wave filter device of claim 13, wherein the input and the output electrodes, in total, have 4 to 40 extensions.

* * * * *